(12) United States Patent
Agarwal et al.

(10) Patent No.: US 8,415,077 B2
(45) Date of Patent: Apr. 9, 2013

(54) SIMULTANEOUS OPTICAL PROXIMITY CORRECTION AND DECOMPOSITION FOR DOUBLE EXPOSURE LITHOGRAPHY

(75) Inventors: Kanak B. Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 12/856,208

(22) Filed: Aug. 13, 2010

(65) Prior Publication Data
US 2012/0040280 A1 Feb. 16, 2012

(51) Int. Cl.
*G03F 1/36* (2012.01)
*G06F 17/50* (2006.01)

(52) U.S. Cl. ............... 430/30; 430/5; 382/144; 716/50; 716/52; 716/53; 716/55

(58) Field of Classification Search ............... 430/5, 30; 382/144; 716/50, 52, 53, 55
See application file for complete search history.

(56) References Cited

U.S. PATENT DOCUMENTS

| | | | |
|---|---|---|---|
| 6,961,916 B2 | 11/2005 | Sarrafzadeh et al. | |
| 7,079,223 B2 | 7/2006 | Rosenbluth et al. | |
| 7,237,221 B2 | 6/2007 | Granik et al. | |
| 7,246,342 B2 | 7/2007 | Hsu et al. | |
| 7,266,798 B2 | 9/2007 | Mansfield et al. | |
| 7,332,251 B2 | 2/2008 | Choi | |
| 7,398,508 B2 | 7/2008 | Shi et al. | |
| 7,434,199 B2 | 10/2008 | Cobb et al. | |
| 7,451,068 B2 | 11/2008 | Melvin, III | |
| 7,539,954 B2 | 5/2009 | Adam | |
| 7,865,864 B2 | 1/2011 | Banerjee et al. | |
| 7,908,572 B2 * | 3/2011 | Zhang | 716/53 |
| 2007/0248899 A1 | 10/2007 | Choi | |
| 2008/0263483 A1 | 10/2008 | Koike et al. | |
| 2009/0199151 A1 | 8/2009 | Banerjee et al. | |
| 2011/0150343 A1 | 6/2011 | Agarwal et al. | |
| 2011/0271238 A1 | 11/2011 | Mansfield et al. | |

OTHER PUBLICATIONS

Bahnas, Mohamed et al., "OPC Model Calibration Considerations for Data Variance", SPIE Advanced Lithography Conference Paper, 2008, 10 pages.
Banerjee, S et al., "Compensating non-optical effects using electrically driven optical proximity correction", Proceedings of the SPIE—The International Society for Optical Engineering, vol. 7275, 2009, Design for Manufacturability through Design-Process Integration III Conference, Feb. 26-27, 2009, 10 pages.
Hsu, Stephen D. et al., "Dipole Decomposition Mask-design for Full Chip Implementation at the 100nm Technology Node and Beyond", SPIE, vol. 4691, 2002, pp. 476-490.
Koike, K et al., "OPC to reduce variability of transistor properties", Proceedings of the SPIE—The International Society for Optical Engineering, vol. 6521, Design for Manufacturability through Design-Process Integration Conference, Feb. 28, 2007, 9 pages.
Teh, Siew-Hong et al., "Device Performance-based OPC for Optimal Circuit Performance and Mask Cost Reduction", Proceedings of SPIE, vol. 6925, 692511, 2008, 8 pages.
Mansfield, Scott M. et al., "Design decomposition for multiple exposures in a process window based OPC flow using tolerance bands", U.S. Appl. No. 12/770,791, filed Apr. 30, 2010, 41 pages.
U.S. Appl. No. 12/024,188.
U.S. Appl. No. 12/645,627.
U.S. Appl. No. 12/770,791.
Notice of Allowance mailed Aug. 3, 2012 for U.S. Appl. No. 12/645,627; 8 pages.
Office Action mailed May 10, 2012 for U.S. Appl. No. 12/645,627; 12 pages.
Response to Office Action filed Jul. 27, 2012, U.S. Appl. No. 12/645,627, 17 pages.

* cited by examiner

*Primary Examiner* — Christopher Young
(74) *Attorney, Agent, or Firm* — Stephen R. Tkacs; Eustus D. Nelson; Stephen J. Walder, Jr.

(57) ABSTRACT

A mechanism is provided for simultaneous optical proximity correction (OPC) and decomposition for double exposure lithography. The mechanism begins with two masks that are equal to each other and to the target. The mechanism simultaneously optimizes both masks to obtain a wafer image that both matches the target and is robust to process variations. The mechanism develops a lithographic cost function that optimizes for contour fidelity as well as robustness to variation. The mechanism minimizes the cost function using gradient descent. The gradient descent works on analytically evaluating the derivative of the cost function with respect to mask movement for both masks. It then moves the masks by a fraction of the derivative.

16 Claims, 9 Drawing Sheets

C-QUAD    Y-DIPOLE    X-DIPOLE

Y-DIPOLE

X-DIPOLE

⇩ OPC

⇩ S.O.D.

SIMULTANEOUS OPTICAL PROXIMITY CORRECTION AND DECOMPOSITION FOR DOUBLE EXPOSURE LITHOGRAPHY

BACKGROUND

The present application relates generally to an improved data processing apparatus and method and more specifically to mechanisms for simultaneous optical proximity correction and decomposition for double exposure lithography.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. Given a target layout of shapes that are desired to be manufactured, masks are generated that account for the non-linearities introduced by the lithographic process that prints wafer features that resemble the target. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep).

Optical proximity correction OPC involves simulating the wafer image given a mask. OPC extracts the geometric error between the simulated wafer feature and the target. The geometric error is called edge placement error (EPE). A cost function is defined as the summation of the EPEs across a layout and modifications of the mask are performed so as to minimize this cost function. OPC arrives at a final mask solution after several iterations of image simulations and mask modifications. One drawback of this type of mask modification is that the image simulation is performed at a single process point, most often under nominal process conditions. Hence, OPC cannot compensate for any variations that may occur during the lithographic process such as variations in lithographic dose and focus.

As we further scale into the deep submicron domain using the same lithographic technology, the process of double patterning has been developed as a cost-effective way to overcame scaling challenges. One popular form of double patterning is double exposure lithography, where a given layout is split or decomposed into two sets of patterns, each of which is printed using a separately optimized illumination. One example of double exposure is double dipole lithography (DDL). This method works on the principle that a horizontal dipole is optimal for printing vertical features, while a vertical dipole is optimal for printing horizontal features. It then decomposes the layout into two patterns—one containing primarily horizontal patterns, and the other containing primarily vertical patterns each of which is printed with its corresponding dipole. However, the decomposition process itself is not trivial as there exist different types of two-dimensional shapes that cannot always be classified as either horizontal or vertical. Some examples of such patterns are jogs and line-ends.

SUMMARY

In one illustrative embodiment, a method, in a data processing system, is provided for simultaneous optical proximity correction and decomposition. The method comprises setting a first lithographic mask and a second lithographic mask equal to a target. The method further comprises performing simultaneous optical proximity correction and decomposition on the first lithographic mask and the second lithographic mask. The method further comprises performing a first lithographic exposure with the first lithographic mask and performing a second lithographic exposure with the second lithographic mask.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for simultaneous optical proximity correction (OPC) and decomposition for double exposure lithography. The mechanism begins with two masks that are equal to each other and to the target. The mechanism simultaneously optimizes both masks to obtain a wafer image that both matches the target and is robust to process variations. It skips the intermediate step of decomposing the target itself into two patterns. The mechanism develops a lithographic cost function that determines contour fidelity as well as robustness to variation. The mechanism minimizes the cost function using gradient descent. The mechanism finds a derivative of the cost function with respect to mask fragment movement for the two masks and moves the mask fragments by a fraction of the derivative. The image changes dynamically during OPC. As long as the final wafer shape matches the target shape, the intermediate target decomposition does not matter. The advantage of using such an optimization methodology is that the second mask provides extra degrees of freedom for optimization.

As stated above, $k_1$ is the factor describing the complexity of resolution enhancement techniques. Low $k_1$ lithography presents significant printability challenges for 22 nm technology. Proposed solutions for improving printability include aggressive use of RET, such as optical proximity correction (OPC), source mask optimization (SMO), and use of two exposures with separately optimized sources. OPC distorts mask features to ensure the actual wafer features resemble the target. OPC is essential for polysilicon and metal1/metal2 layers.

Figure 1A:
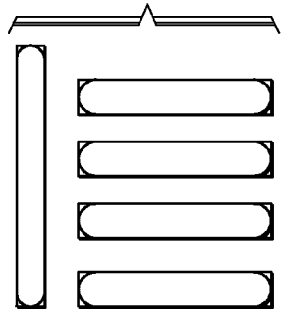
FIG. 1A depicts an example target for wafer features using lithography.
Figure 1B:
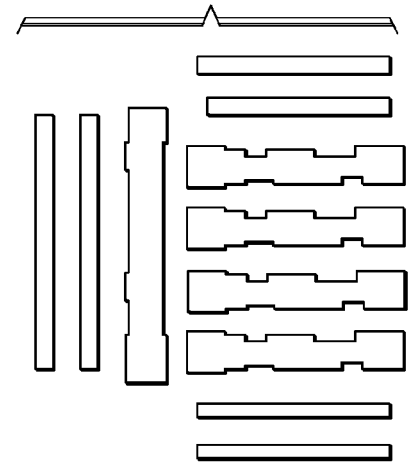
FIG. 1B depicts an example mask after optical proximity correction and sub-wavelength resolution assist feature (SRAF) insertion in accordance with a known optical proximity correction technique.

Model-based OPC fragments the mask to generate movable mask edges. Model-based OPC uses image prediction using optical and resist models. Model-based OPC uses edge movement algorithms for reduction of geometric error. FIG. 1A depicts an example target for wafer features using lithography. FIG. 1B depicts an example mask after optical proximity correction and sub-wavelength resolution assist feature (SRAF) insertion in accordance with a known optical proximity correction technique. In the example depicted in FIGS. 1A and 1B, the OPC technique may take 15 or more iterations.

Double exposure is a technique using two exposures to print a layout. The double exposure technique fixes sources for the exposures. This technique comprises decomposing the layout to generate two different masks. The final wafer contour is equal to the sum of the two exposures.

A single source is not optimal for all shape constructs. Using double exposure, multiple sources may be tuned to be optimal for different constructs. The double exposure technique may decompose the layout to print a particular construct with its most optimal source. Double exposure is also cheaper than the frequency doubling patterning flows (e.g., litho-etch, litho-etch (LELE)) with separate exposure and etch steps.

Figure 2:
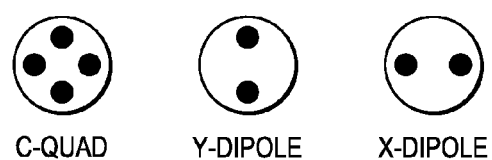
FIG. 2 illustrates known lithography illumination configurations.

One example of a double exposure technique is double dipole lithography (DDL). FIG. 2 illustrates known lithography exposure configurations. For horizontal features, a Y-dipole is optimal. For vertical features, an X-dipole is optimal. C-quad featuring both an X-dipole and a Y-dipole may be a solution; however, a C-quad may result in degraded contrast for a single orientation due to the other dipole.

Double dipole lithography splits the layout into horizontal and vertical features. This process if splitting is called layout decomposition. DDL uses the X-dipole to expose vertical features and uses the Y-dipole to expose horizontal features.

Figure 3:
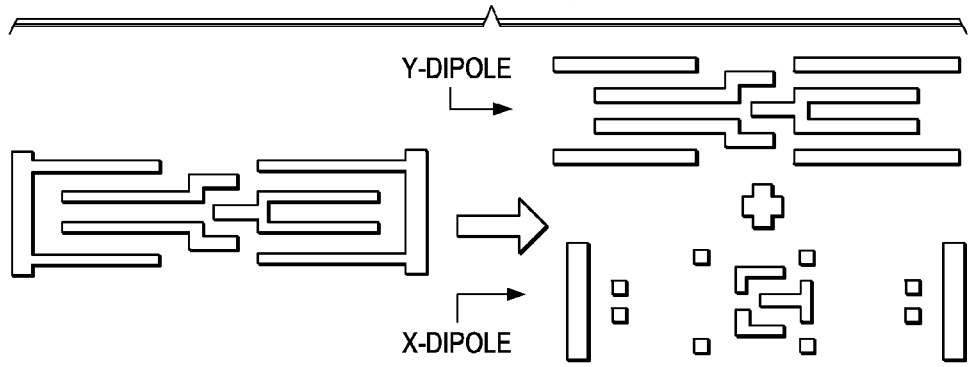
FIG. 3 depicts an example of ruled-based decomposition.

One known decomposition technique is rule-based decomposition. In integrated circuit designs, the presence of jogs, line ends, landing pads, and the like complicates rule-based decomposition. The rules may work for traditional sources, like vertical/horizontal decomposition for X- and Y-dipoles in DDL, but are hard to develop for complex individually optimized sources. FIG. 3 depicts an example of ruled-based decomposition. As shown in FIG. 3, the layout is split between a mask for a Y-dipole exposure and a mask for an X-dipole exposure.

Figure 4:
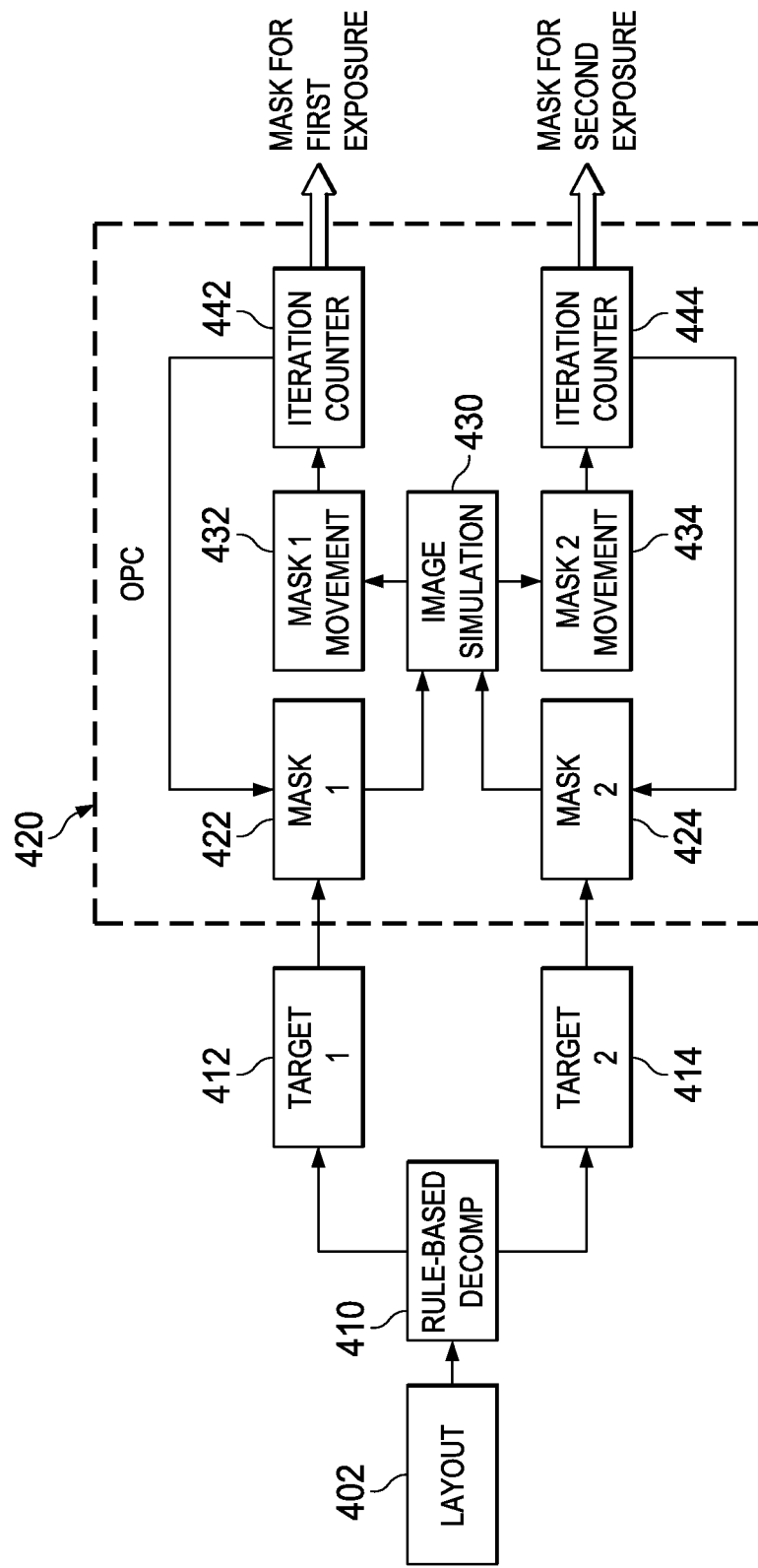
FIG. 4 is a block diagram of rule-based decomposition for optical proximity correction in accordance with an illustrative embodiment.

FIG. 4 is a block diagram of rule-based decomposition for optical proximity correction in accordance with an illustrative embodiment. Rule-based decomposition 410 receives layout 402 and divides layout 402 into target 1 412 and target 2 414. The rule-based decomposition flow comprises splitting the original layout into target 1 (412) and target 2 (414). An optical proximity correction (OPC) tool (420) then does the task of converting target 1 412 into mask 1 422 and converting target 414 into mask 2 424. In one example embodiment, rule-based decomposition 410 may split layout 402 into target 1 412 for Y-dipole lithography and target 2 414 for X-dipole lithography.

In optical proximity correction 420, image simulation 430 receives mask 1 422 and mask 2 424 and generates a simulated wafer image. Based on differences between the simulated wafer image and the target wafer image, mask 1 movement 432 and mask 2 movement 434 move mask edges to optimize the simulated image to be closer to the target image. Iteration counter 442 increments for each mask 1 movement 432. Iteration counter 444 increments for each mask 2 movement 434.

Mask 1 movement 432 results in a new mask 1 422, and mask 2 movement 434 results in a new mask 2 424. Image simulation 430 then generates a new simulated wafer image. Mask 1 movement 432 and mask 2 movement 434 move mask edges to optimize the simulated image to be closer to the target image, and iteration counters 442 and 444 increment until OPC reaches a predetermined number of iterations. After the predetermined number of iterations, OPC results in a mask for the $1^{st}$ exposure and a mask for the $2^{nd}$ exposure.

Another example of a known decomposition technique is model-based decomposition. Model-based decomposition utilizes models of lithographic systems to predict the image after exposure. For each edge in the layout, model-based decomposition compares the image log slope (ILS) from each exposure. ILS represents how fast the feature transitions from high intensity to low intensity. ILS is a measure of robustness to process variation. Higher ILS results in better printability. Model-based decomposition assigns edges to exposure that result in better ILS. Model-based decomposition is more scalable and more robust to process variation than rule-based decomposition. However, the slope after OPC may be very different from the initial slope. A more optimal solution may be obtained by integrating the two processes.

Figure 5:
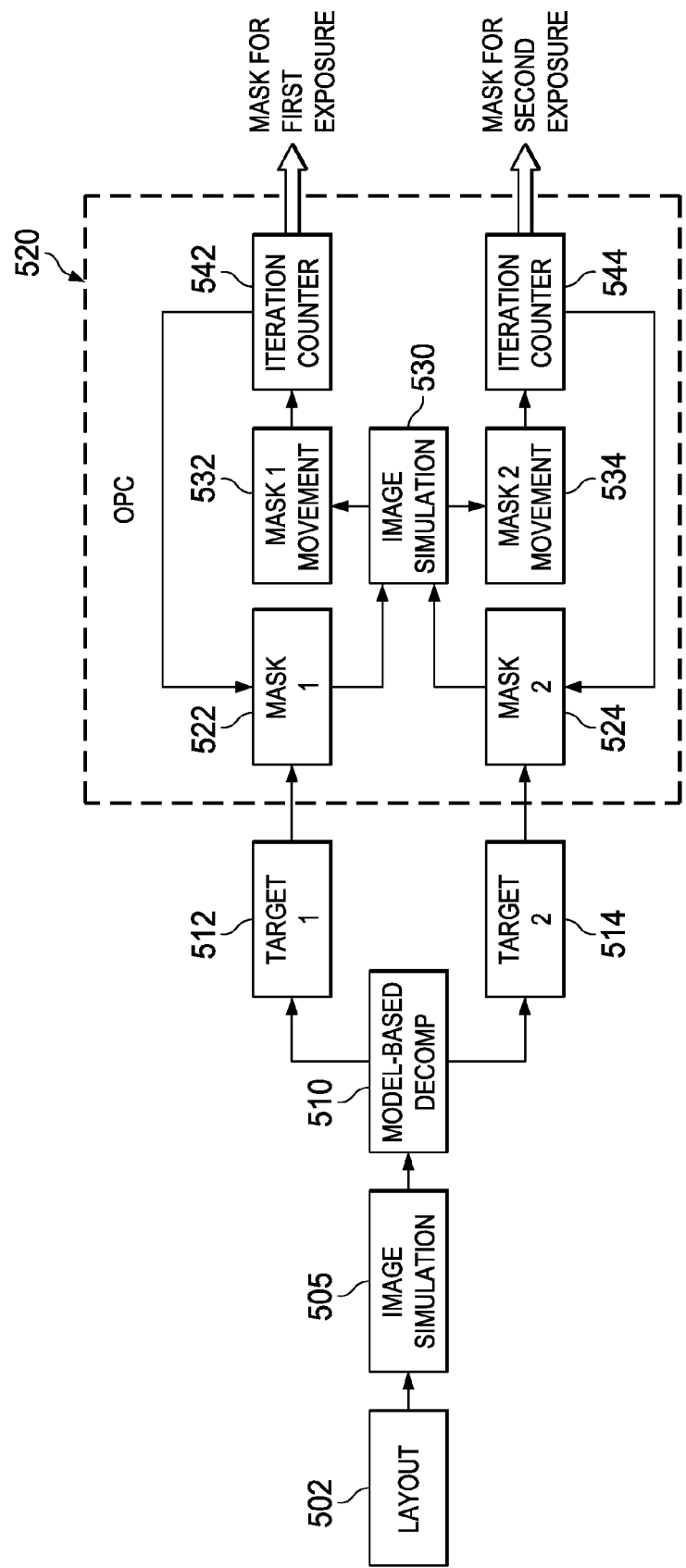
FIG. 5 is a block diagram of model-based decomposition for optical proximity correction in accordance with an illustrative embodiment.

FIG. 5 is a block diagram of model-based decomposition for optical proximity correction in accordance with an illustrative embodiment. Image simulation 505 receives layout 502 and generates a simulated image of the wafer based on layout 502. Model-based decomposition 510 receives the output of image simulation 505 and generates target 1 512 and target 2 514. The model-based decomposition flow comprises converting target 1 512 into mask 1 522 and converting target 2 514 into mask 2 524 for optical proximity correction 520.

In optical proximity correction 520, image simulation 530 receives mask 1 522 and mask 2 524 and generates a simulated wafer image. Based on differences between the simulated wafer image and the target wafer image, mask 1 movement 532 and mask 2 movement 534 move mask edges to optimize the simulated image to be closer to the target image. Iteration counter 542' increments for each mask 1 movement 532. Iteration counter 544 increments for each mask 2 movement 534.

Mask 1 movement 532 results in a new mask 1 522, and mask 2 movement 534 results in a new mask 2 524. Image simulation 530 then generates a new simulated wafer image. Mask 1 movement 532 and mask 2 movement 534 move mask edges to optimize the simulated image to be closer to the target image, and iteration counters 542 and 544 increment until OPC reaches a predetermined number of iterations. After the predetermined number of iterations, OPC results in a mask for the $1^{st}$ exposure and a mask for the $2^{nd}$ exposure.

In accordance with an illustrative embodiment, a mechanism is provided for simultaneous optical proximity correction (OPC) and decomposition for double exposure lithography. The mechanism begins with two masks that are equal to each other and to the target. It avoids the intermediate step of decomposing the target layout into two individual targets for mask generation. Instead, the mechanism simultaneously optimizes both masks to obtain a wafer image that both matches the target and is robust to process variations. The mechanism develops a lithographic cost function that determines contour fidelity as well as robustness to variation. The mechanism minimizes the cost function using gradient descent. The mechanism finds a derivative of the cost function with respect to mask movement for the two masks and moves the masks by a fraction of the derivative. The image changes dynamically during OPC. The premise of this method is that as long as the final wafer shape matches the target shape, the intermediate target decomposition does not matter. The advantage of using such an approach is that the second mask provides extra degrees of freedom for optimization.

Figure 6:
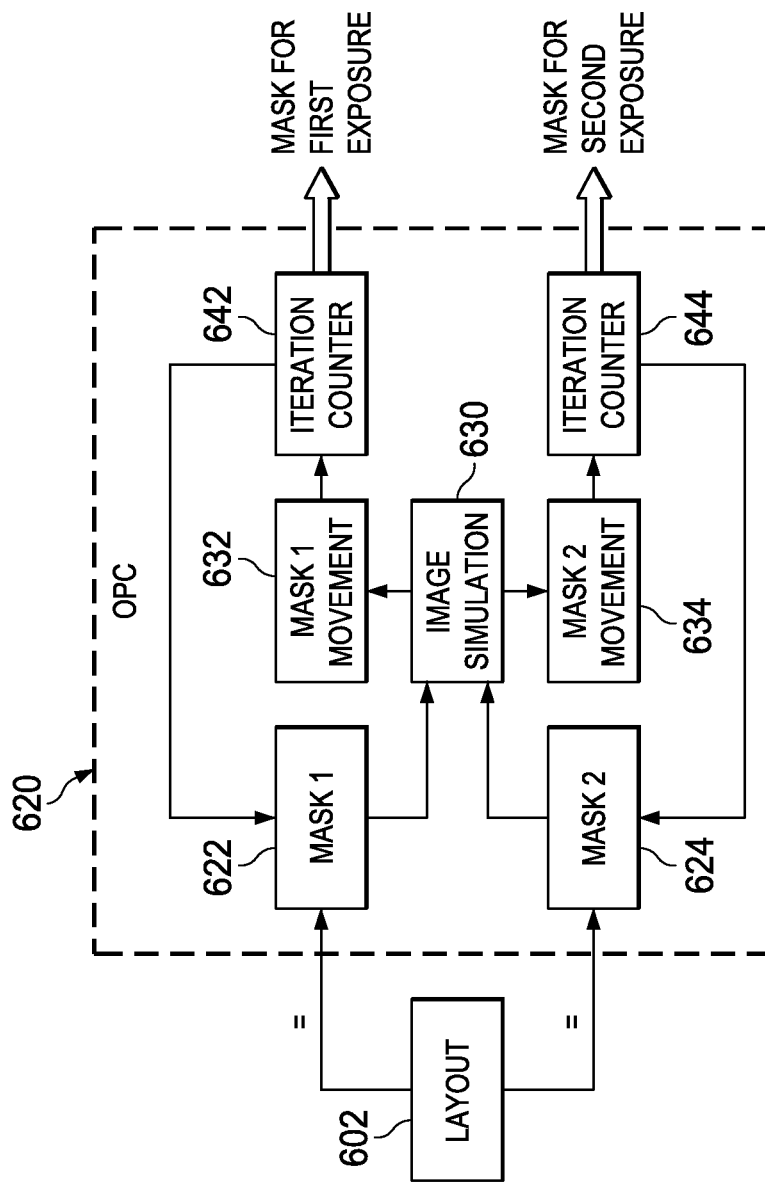
FIG. 6 is a block diagram of simultaneous optical proximity correction and decomposition in accordance with an illustrative embodiment.

FIG. 6 is a block diagram of simultaneous optical proximity correction and decomposition in accordance with an illustrative embodiment. The simultaneous OPC and decomposition (SOD) technique starts with layout 602 and generates mask 1 622 and mask 2 624, which are equal to layout 602. Because the method does not initially decompose the target itself into horizontally and vertically oriented components, OPC 620 may not necessarily generate primarily horizontal and vertical oriented masks.

In optical proximity correction 620, image simulation 630 receives mask 1 622 and mask 2 624 and generates a simulated wafer image. Based on differences between the simulated wafer image and the target wafer image, as well as the slope of the image at the target edge, mask 1 movement 632 and mask 2 movement 634 move mask edges to optimize the simulated image to be closer to the target image and also to improve the slope of the image. Iteration counter 642 increments for each mask 1 movement 632. Iteration counter 644 increments for each mask 2 movement 634.

Mask 1 movement 632 results in a new mask 1 622, and mask 2 movement 634 results in a new mask 2 624. Image simulation 630 then generates a new simulated wafer image. Mask 1 movement 632 and mask 2 movement 634 move mask edges to optimize the simulated image to be closer to the target image, and iteration counters 642 and 644 increment until OPC reaches a predetermined number of iterations. After the predetermined number of iterations, OPC results in a mask for the $1^{st}$ exposure and a mask for the $2^{nd}$ exposure.

In the SOD technique within the flow shown in FIG. 6, OPC 620 starts with mask 1 622 and mask 2 624 that are both equal to the target. The SOD technique develops a lithographic cost function that determines contour fidelity as well as robustness to variation. The cost function is as follows:

$$C_{OPC/Decomp} = w(\Delta I)^2 + (1-w)\exp(-|\partial I/\partial x|)$$

where I is the light intensity at a particular site, $\Delta I$ is the intensity error, x is distance, and w is a weight that can be dynamically tuned at each OPC iteration in order to prioritize slope optimization over fidelity and vice versa.

Figure 7:
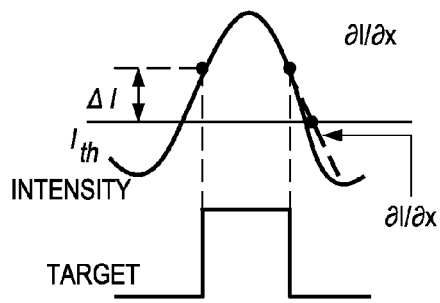
FIG. 7 illustrates defining intensity error and slope given a waveform of intensity compared to a target feature.

FIG. 7 illustrates defining intensity error and slope given a profile of intensity compared to a target feature. The value of $I_{th}$ defines the light intensity threshold above which the feature will print and below which the feature will not print. As seen in FIG. 7, $\Delta I$ is the error. Reducing $\Delta I$ brings the resulting wafer image closer to the target. Also shown in FIG. 7, $\partial I/\partial x$ is the image slope. When normalized to the intensity at the point, it is called the image log slope (ILS). Increasing this quantity reduces the sensitivity of the image to variations in lithographic dose, thus improving the robustness of the wafer image. Using the exponential of slope allows us to place a high penalty on poor image slope and also to have an easily differentiable form for further use in minimizing the cost function.

The SOD technique minimizes the cost function using gradient descent. The SOD technique finds a derivative of the cost function at a particular site with respect to mask movement for mask 1 and mask 2 ($m_1$, $m_2$) corresponding to that site. The SOD technique then moves the mask by a fraction of the derivative, which is determined as follows:

$$\Delta m_1 = -\eta \frac{\partial C}{\partial m_1}$$

$$\Delta m_2 = -\eta \frac{\partial C}{\partial m_2}$$

where $\eta$ is a predetermined constant that determines what fraction of the gradient by which to move. Usually it is kept at a small value to move towards the optimal solution in small steps without causing oscillatory behavior. The final image intensity sum of individual exposure intensities is defined as follows:

$$\Delta I = I_1 + I_2 - I_{th}$$

This computation is similar for slope, which is as follows:

$$\nabla I = \nabla I_1 + \nabla I_2$$

The first-order derivative is analytically obtained when cross-terms ($\partial I_1/\partial m_2$, $\partial I_2/\partial m_2$) are zero, as follows:

$$\frac{\partial C_{OPC/Decomp}}{\partial m_1} = 2w(I_1 + I_2 - I_{th})\frac{\partial I_1}{\partial m_1} - (1-w)\frac{\partial \nabla I_1}{\partial m_1}\exp(-\nabla I_1 - \nabla I_2)$$

$$\frac{\partial C_{OPC/Decomp}}{\partial m_2} = 2w(I_1 + I_2 - I_{th})\frac{\partial I_2}{\partial m_2} - (1-w)\frac{\partial \nabla I_2}{\partial m_2}\exp(-\nabla I_1 - \nabla I_2)$$

where $\nabla I$ is the gradient of the light intensity or image slope (same as $\partial I/\partial x$).

Figure 8:
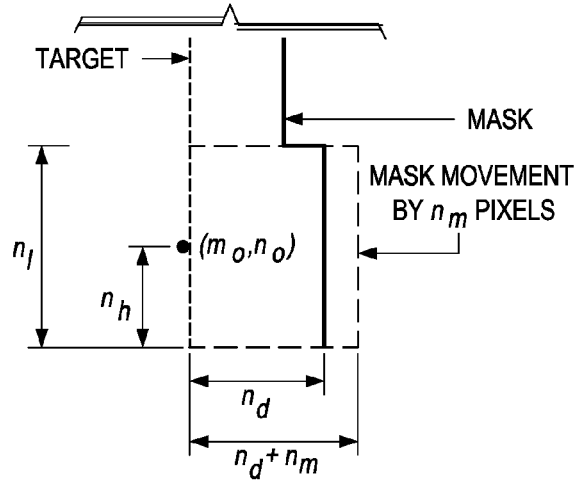
FIG. 8 illustrates a mask fragment movement in accordance with an illustrative embodiment.

FIG. 8 illustrates a mask fragment movement in accordance with an illustrative embodiment. Assuming that the mask fragment moves by one pixel, the change in intensity gives $\partial I/\partial m$. The mask fragment movement can be analytically evaluated by perturbation of Hopkins equations and sped up using lookup tables for both intensity and slope and for both exposures as long as kernels $h_1$ and $h_2$ for both sources are known. This results in the following equations:

$$I_1(m_0, n_0) = \sum_{k=1}^{K} s_k |h_k^1(m_0, n_0) Ä M_1(m_0, n_0)|$$

$$I_2(m_0, n_0) = \sum_{k=1}^{K} s_k |h_k^2(m_0, n_0) Ä M_2(m_0, n_0)|$$

Here, ($m_0$, $n_0$) represent the co-ordinates of a point in two-dimensions, while $I(m_0, n_0)$ represents the intensity at that point. $M(m_0, n_0)$ represents the value of the mask transmission at that point. For a binary mask this is usually 0 or +1, but can take on different values for phase-shifted masks. The image is usually represented as a function of the mask using Hopkins equations of partial coherence. Performing a singular value decomposition on the equations allows us to write the image as a summation of convolutions. $\sigma_k$ represents the $k^{th}$ singular value in the decomposition while $h_k$ represents the $k^{th}$ eigenvector of the decomposition and is often referred to as an optical kernel. These optical kernels are a function of the type of source and optical system used. Since we have two different exposures, we also have two sets of optical kernels $h_1$ and $h_2$ to represent the imaging process for each exposure as a function of the mask for that exposure ($M_1$ and $M_2$ respectively).

Figure 9A:
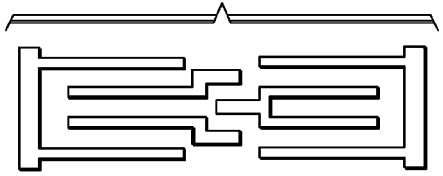
FIG. 9A illustrates experimental results for rule-based decomposition in accordance with an illustrative embodiment.
Figure 9A:
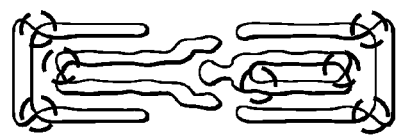
Figure 9B:
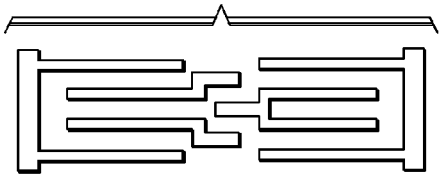
FIG. 9B illustrates experimental results for simultaneous optical proximity correction and decomposition in accordance with an illustrative embodiment.
Figure 9B:
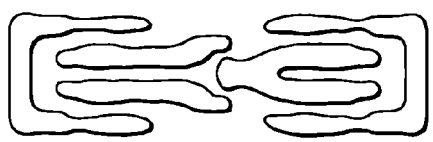

FIG. 9A illustrates experimental results for rule-based decomposition in accordance with an illustrative embodiment. The lithography simulation for this example was performed using 22 nm kernels with double dipole sources. For comparison, the example uses the rule-based decomposition flow followed by OPC on mask1 and mask2, such as shown in FIG. 4. The OPC algorithm itself uses a constant fragmentation scheme for both masks. Lithography simulations are performed at dose values of +/−2%, and this shows the presence of hotspots In contrast, FIG. 9B illustrates experimental results for simultaneous optical proximity correction and decomposition in accordance with an illustrative embodiment. The example shown in FIG. 9B started with mask1 equal to mask2 equal to the target. The fragment movement according to the proposed embodiment uses in the same fragmentation, the same number of iterations, but no hotspots.

Figure 10:
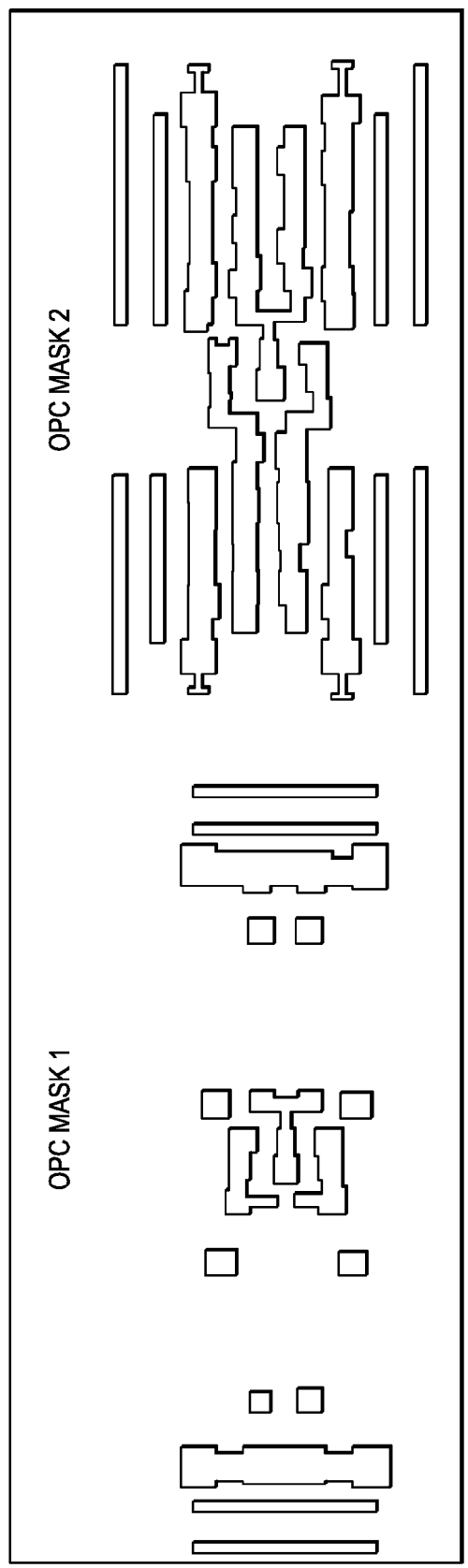
FIG. 10 illustrates example masks resulting from rule-based decomposition in accordance with an illustrative embodiment.
Figure 11:
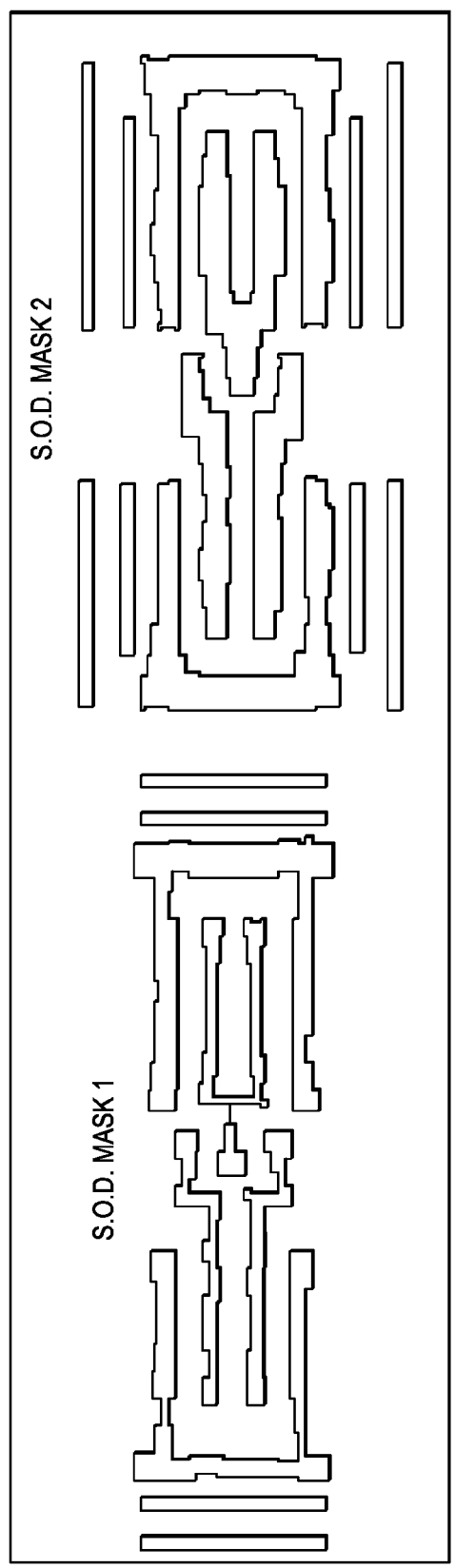
FIG. 11 illustrates example masks resulting from simultaneous optical proximity correction and decomposition in accordance with an illustrative embodiment.

FIG. 10 illustrates example masks resulting from rule-based decomposition in accordance with an illustrative embodiment. FIG. 11 illustrates example masks resulting from simultaneous optical proximity correction and decomposition in accordance with an illustrative embodiment. As seen in FIG. 11, compared to FIG. 10, the individual masks may be more complicated and are not necessarily decomposed according to horizontal and vertical features.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 12:
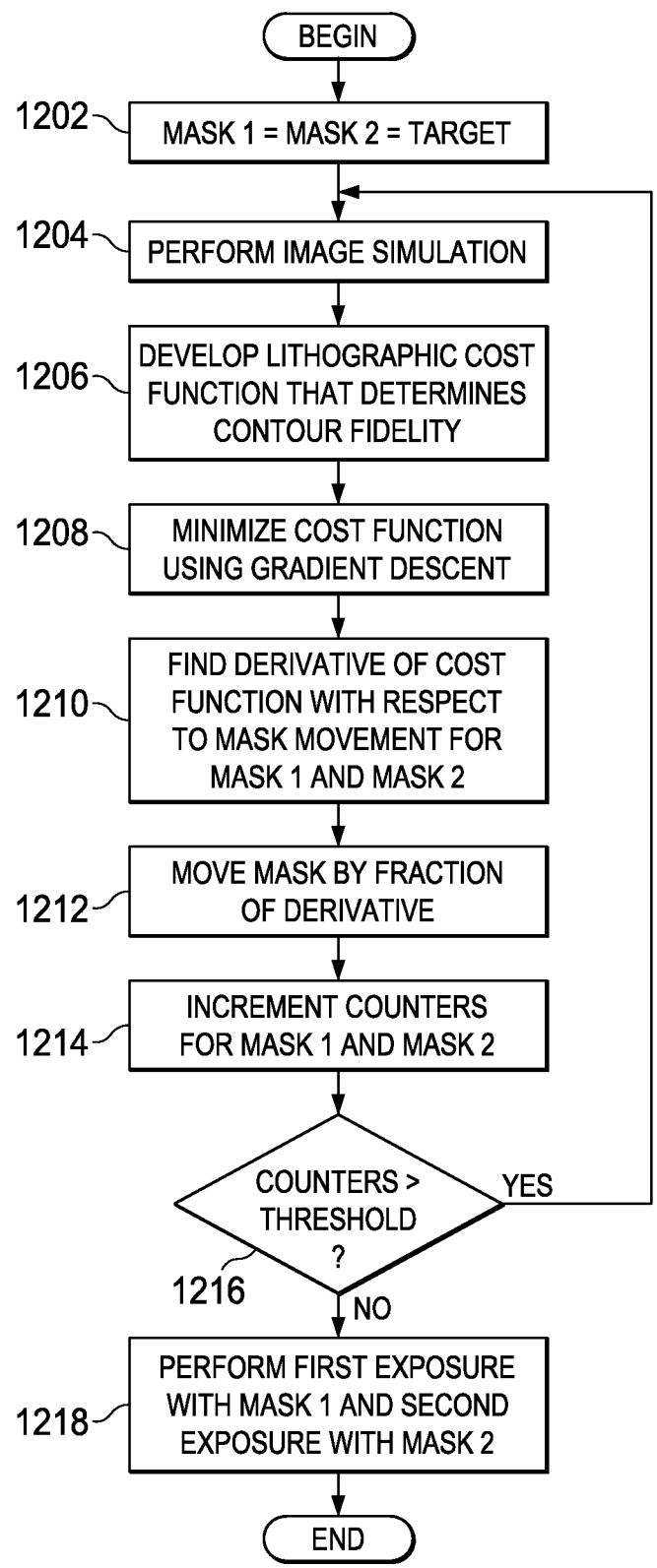
FIG. 12 is a flowchart illustrating operation of a mechanism for simultaneous optical proximity correction and decomposition in accordance with an illustrative embodiment.

FIG. 12 is a flowchart illustrating operation of a mechanism for simultaneous optical proximity correction and decomposition in accordance with an illustrative embodiment. Operation begins, and the mechanism sets mask1 equal to mask2, which are both equal to the target (block 1202). The mechanism performs image simulation (block 1204) and develops a lithographic cost function that determines contour fidelity, as well as robustness to variation (block 1206). The mechanism minimizes the cost function using gradient descent (block 1208) and finds a derivative of the cost function with respect to mask movement for mask1 and mask2 (block 1210). Then, the mechanism moves each mask by a fraction of the derivative (block 1212).

The mechanism increments the mask counters for mask1 and mask2 (block 1214). The mechanism then determines whether the counters are greater than a predetermined threshold (block 1216). If the counters are greater than the threshold, then operation returns to block 1204 to perform simulation given the new mask1 and mask2. If the counters are not greater than the threshold in block 1216, then the mechanism performs a first exposure with mask1 and a second exposure with mask2 to perform double exposure lithography (block 1218). Thereafter, operation ends, The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 13:
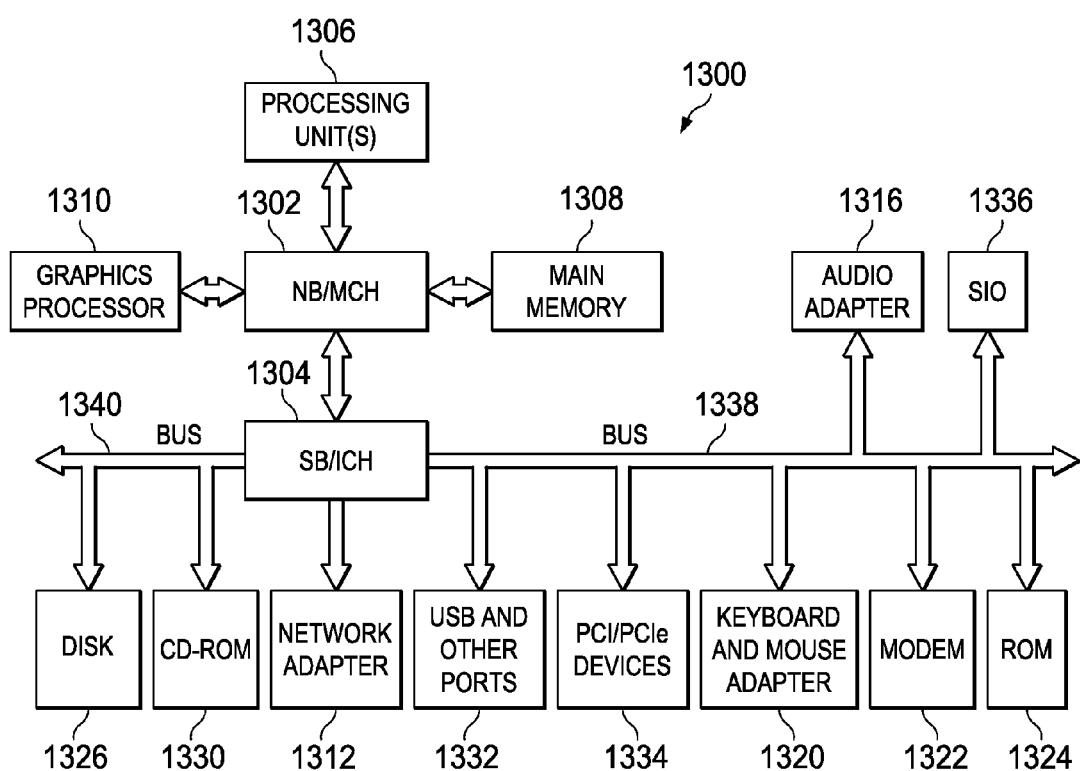
FIG. 13 is a block diagram of an example data processing system is shown in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIG. 13 is provided hereafter as example environment in which aspects of the illustrative embodiments may be implemented. While the description focuses primarily on a single data processing device implementation, this is only an example and is not intended to state or imply any limitation with regard to the features of the present invention. To the contrary, the illustrative embodiments are intended to include distributed data processing environments and embodiments.

FIG. 13 is a block diagram of an example data processing system in which aspects of the illustrative embodiments may be implemented. Data processing system 1300 is an example of a computer in which computer usable code or instructions implementing the processes for illustrative embodiments of the present invention may be located. It should be appreciated that FIG. 13 are only examples and are not intended to assert or imply any limitation with regard to the environments in which aspects or embodiments of the present invention may be implemented. Many modifications to the depicted environments may be made without departing from the spirit and scope of the present invention.

In the depicted example, data processing system 1300 employs a hub architecture including north bridge and memory controller hub (NB/MCH) 1302 and south bridge and input/output (I/O) controller hub (SB/ICH) 1304. Processing unit 1306, main memory 1308, and graphics processor 1310 are connected to NB/MCH 1302, Graphics processor 1310 may be connected to NB/MCH 1302 through an accelerated graphics port (AGP).

In the depicted example, local area network (LAN) adapter 1312 connects to SB/ICH 1304. Audio adapter 1316, keyboard and mouse adapter 1320, modem 1322, read only memory (ROM) 1324, hard disk drive (HDD) 1326, CD-ROM drive 1330, universal serial bus (USB) ports and other communication ports 1332, and PCI/PCIe devices 1334 connect to SB/ICH 1304 through bus 1338 and bus 1340. PCI/PCIe devices may include, for example, Ethernet adapters, add-in cards, and PC cards for notebook computers. PCI uses a card bus controller, while PCIe does not. ROM 1324 may be, for example, a flash basic input/output system (BIOS).

HDD 1326 and CD-ROM drive 1330 connect to SB/ICH 1304 through bus 1340. HDD 1326 and CD-ROM drive 1330 may use, for example, an integrated drive electronics (IDE) or serial advanced technology attachment (SATA) interface. Super I/O (SIO) device 1336 may be connected to SB/ICH 1304.

An operating system runs on processing unit 1306. The operating system coordinates and provides control of various components within the data processing system 1300 in FIG. 13. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 1300 (Java is a trademark of Sun Microsystems, Inc. in the United States, other countries, or both).

As a server, data processing system 1300 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 1300 may be a symmetric multiprocessor (SMP) system including a plurality of processors in processing unit 1306. Alternatively, a single processor system may be employed.

Instructions for the operating system, the object-oriented programming system, and applications or programs are located on storage devices, such as HDD 1326, and may be loaded into main memory 1308 for execution by processing unit 1306. The processes for illustrative embodiments of the present invention may be performed by processing unit 1306 using computer usable program code, which may be located in a memory such as, for example, main memory 1308, ROM 1324, or in one or more peripheral devices 1326 and 1330, for example.

A bus system, such as bus 1338 or bus 1340 as shown in FIG. 13, may be comprised of one or more buses. Of course, the bus system may be implemented using any type of communication fabric or architecture that provides for a transfer of data between different components or devices attached to the fabric or architecture. A communication unit, such as modem 1322 or network adapter 1312 of FIG. 13, may include one or more devices used to transmit and receive data. A memory may be, for example, main memory 1308, ROM 1324, or a cache such as found in NB/MCH 1302 in FIG. 13.

Those of ordinary skill in the art will appreciate that the hardware in FIG. 13 may vary depending on the implementation. Other internal hardware or peripheral devices, such as flash memory, equivalent non-volatile memory, or optical disk drives and the like, may be used in addition to or in place of the hardware depicted in FIG. 13. Also, the processes of the illustrative embodiments may be applied to a multiprocessor data processing system, other than the SMP system mentioned previously, without departing from the spirit and scope of the present invention.

Moreover, the data processing system 1300 may take the form of any of a number of different data processing systems including client computing devices, server computing devices, a tablet computer, laptop computer, telephone or other communication device, a personal digital assistant (PDA), or the like. In some illustrative examples, data processing system 1300 may be a portable computing device which is configured with flash memory to provide non-volatile memory for storing operating system files and/or user-generated data, for example. Essentially, data processing system 1300 may be any known or later developed data processing system without architectural limitation.

Thus, the illustrative embodiments provide a mechanism for simultaneous optical proximity correction (OPC) and decomposition for double exposure lithography. The mechanism begins with two masks that are equal to each other and to the target. The mechanism simultaneously optimizes both masks to obtain a wafer image that both matches the target and is robust to process variations. The mechanism develops a lithographic cost function that determines contour fidelity as well as robustness to variation. The mechanism minimizes the cost function using gradient descent. The mechanism finds a derivative of the cost function with respect to mask movement for the two masks and moves the masks by a fraction of the derivative.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for simultaneous optical proximity correction and decomposition, the method comprising:
    setting a first lithographic mask and a second lithographic mask equal to a target;
    performing simultaneous optical proximity correction and decomposition using the first lithographic mask and the second lithographic mask; and
    performing a first lithographic exposure with the first lithographic mask and performing a second lithographic exposure with the second lithographic mask to produce a final layout target closely resembling the original.

2. The method of claim 1, wherein performing simultaneous optical proximity correction and decomposition comprises:
    performing image simulation based on the first lithographic mask and the second lithographic mask;
    developing a lithographic cost function that determines contour fidelity as well as robustness of the image to process variations; and
    moving the first lithographic mask and the second lithographic mask based on the lithographic cost function.

3. The method of claim 2, wherein performing simultaneous optical proximity correction and decomposition further comprises:
    repeating performing image simulation, developing a lithographic cost function, and moving the first lithographic mask and the second lithographic mask a predetermined number of times.

4. The method of claim 2, wherein the cost function is determined according to the following equation:

$$C_{OPC/Decomp} = w(\Delta I)^2 + (1-w)\exp(-|\partial I/\partial x|)$$

where I is the light intensity at a particular site, $\Delta I$ is the intensity error and x is distance, and w is a weight that can be dynamically tuned at each iteration in order to prioritize slope optimization over fidelity and vice versa.

5. The method of claim 4, wherein moving the first lithographic mask and the second lithographic mask based on the lithographic cost function comprises:
    minimizing the cost function using gradient descent;
    finding analytically a derivative of the cost function with respect to mask movement for the first lithographic mask and the second lithographic mask;
    utilizing the kernels representing the two exposures to analytically obtain the derivative of the image intensity and slope while determining the derivative of the cost function; and
    moving the first lithographic mask, $m_1$, and the second lithographic mask, $m_2$, by a pre-specified fraction of the derivative.

6. The method of claim 5, further comprising:
    determining first lithographic mask movement, $\Delta m_1$, and determining second lithographic mask movement, $\Delta m_2$, according to the following equations:

$$\Delta m_1 = -\eta \frac{\partial C}{\partial m_1}$$

$$\Delta m_2 = -\eta \frac{\partial C}{\partial m_2}$$

where $\eta$ is a predetermined constant.

7. The method of claim 6, wherein finding analytically a derivative of the cost function with respect to mask movement for the first lithographic mask and the second lithographic mask comprises determining the derivative of the cost function with respect to mask movement according to the following equation:

$$\frac{\partial C_{OPC/Decomp}}{\partial m_1} = 2w(I_1 + I_2 - I_{th})\frac{\partial I_1}{\partial m_1} - (1-w)\frac{\partial \nabla I_1}{\partial m_1}\exp(-\nabla I_1 - \nabla I_2)$$

$$\frac{\partial C_{OPC/Decomp}}{\partial m_2} = 2w(I_1 + I_2 - I_{th})\frac{\partial I_2}{\partial m_2} - (1-w)\frac{\partial \nabla I_2}{\partial m_2}\exp(-\nabla I_1 - \nabla I_2)$$

where $\nabla I$ is the gradient of the light intensity function.

8. A computer program product comprising a computer readable storage medium having a computer readable program stored therein, wherein the computer readable program, when executed on a computing device, causes the computing device to:
    set a first lithographic mask and a second lithographic mask equal to a target;
    perform simultaneous optical proximity correction and decomposition on the first lithographic mask and the second lithographic mask; and
    perform a first lithographic exposure with the first lithographic mask and performing a second lithographic exposure with the second lithographic mask.

9. The computer program product of claim 8, wherein performing simultaneous optical proximity correction and decomposition comprises:
    performing image simulation based on the first lithographic mask and the second lithographic mask;
    developing a lithographic cost function that determines contour fidelity as well as robustness of the image to process variations; and
    moving the first lithographic mask and the second lithographic mask based on the lithographic cost function.

10. The computer program product of claim 9, wherein performing simultaneous optical proximity correction and decomposition further comprises:
    repeating performing image simulation, developing a lithographic cost function, and moving the first lithographic mask and the second lithographic mask a predetermined number of times.

11. The computer program product of claim 9, wherein the cost function at a site is determined according to the following equation:

$$C_{OPC/Decomp} = w(\Delta I)^2 + (1-w)\exp(-|\partial I/\partial x|)$$

where I is the light intensity at a particular site, $\Delta I$ is the intensity error and x is distance, and w is a weight that can be dynamically tuned at each iteration in order to prioritize slope optimization over fidelity and vice versa.

12. The computer program product of claim 11, wherein moving the first lithographic mask and the second lithographic mask based on the lithographic cost function comprises:
    minimizing the cost function using gradient descent;
    finding analytically a derivative of the cost function with respect to mask movement for the first lithographic mask and the second lithographic mask;
    utilizing the kernels representing the two exposures to analytically obtain the derivative of the image intensity and slope white determining the derivative of the cost function; and
    moving the first lithographic mask, $m_1$, and the second lithographic mask, $m_2$, by a pre-specified fraction of the derivative.

13. The computer program product of claim 12, further comprising:
determining first lithographic mask movement, $\Delta m1$, and determining second lithographic mask movement, $\Delta m2$, according to the following equations:

$$\Delta m_1 = -\eta \frac{\partial C}{\partial m_1}$$

$$\Delta m_2 = -\eta \frac{\partial C}{\partial m_2}$$

where $\eta$ is a predetermined constant.

14. The computer program product of claim 13, wherein finding analytically a derivative of the cost function with respect to mask movement for the first lithographic mask and the second lithographic mask comprises determining the derivative of the cost function with respect to mask movement according to the following equation:

$$\frac{\partial C_{OPC/Decomp}}{\partial m_1} = 2w(I_1 + I_2 - I_{th})\frac{\partial I_1}{\partial m_1} - (1-w)\frac{\partial \nabla I_1}{\partial m_1}\exp(-\nabla I_1 - \nabla I_2)$$

$$\frac{\partial C_{OPC/Decomp}}{\partial m_2} = 2w(I_1 + I_2 - I_{th})\frac{\partial I_2}{\partial m_2} - (1-w)\frac{\partial \nabla I_2}{\partial m_2}\exp(-\nabla I_1 - \nabla I_2)$$

where $\nabla I$ is the gradient of the light intensity function.

15. The computer program product of claim 8, wherein the computer readable program is stored in a computer readable storage medium in a data processing system and wherein the computer readable program was downloaded over a network from a remote data processing system.

16. The computer program product of claim 8, wherein the computer readable program is stored in a computer readable storage medium in a server data processing system and wherein the computer readable program is downloaded over a network to a remote data processing system for use in a computer readable storage medium with the remote system.

* * * * *